United States Patent [19]

Murphy

[11] Patent Number: 4,763,341
[45] Date of Patent: Aug. 9, 1988

[54] DIGITAL TIMING USING A STATE MACHINE

[75] Inventor: Richard L. Murphy, Grass Valley, Calif.

[73] Assignee: The Grass Valley Group, Inc., Grass Valley, Calif.

[21] Appl. No.: 19,081

[22] Filed: Feb. 25, 1987

[51] Int. Cl.⁴ .................... H03K 5/19; H03K 9/08
[52] U.S. Cl. ...................... 377/20; 328/111; 328/119; 375/116
[58] Field of Search ............. 328/111, 119; 377/20; 375/116

[56] References Cited

U.S. PATENT DOCUMENTS

| | | | |
|---|---|---|---|
| 3,686,634 | 8/1972 | Malchman et al. | 377/20 |
| 3,894,287 | 7/1975 | Mathiesen | 328/119 |
| 4,232,267 | 11/1980 | Hanajima et al. | 328/119 |
| 4,651,332 | 3/1987 | Brown | 377/20 |
| 4,683,495 | 7/1987 | Brock | 377/20 |
| 4,692,710 | 9/1987 | Shuartsman | 328/111 |

*Primary Examiner*—John S. Heyman
*Attorney, Agent, or Firm*—Francis I. Gray

[57] ABSTRACT

A digital timing generator using a state machine detects the presence of a predetermined pulse pattern at the input to generate a valid pulse output, and from the periodic repetition of the valid pulse output indicates the presence or absence of an input signal having the predetermined pulse pattern. The edges of the pulses at the input are detected and the pulse widths are determined by a time duration counter as being within the limits corresponding to the predetermined pulse pattern. A valid pulse counter is incremented for each pulse having the proper pulse width, and when the count of the counter reaches a predetermined value a valid pulse output is indicated. The valid pulse output may be delayed before being input to a signal presence detector. Each valid pulse output restarts a time interval counter and increments a valid input counter so long as the time interval timer does not reach a maximum time interval. When a predetermined minimum value of the valid input counter is reached, a valid input signal is indicated. Then the valid input counter counts the number of consecutive times that the maximum time interval is reached without the receipt of the valid pulse output, indicating the absence of the input signal when a predetermined maximum value is reached.

10 Claims, 6 Drawing Sheets

DIGITAL TIMING USING A STATE MACHINE

BACKGROUND OF THE INVENTION

The present invention relates to digital timing generation, and more particularly to digital timing generation using a state machine to identify a specific pulse pattern within an input signal from which the presence of a valid input signal may be determined.

In many applications electrical signals occur which have an identification pulse pattern which occurs at a periodic rate. One such signal is the composite sync signal of a television signal which has a definite pulse pattern to identify the vertical sync portion of the composite sync signal, i.e., the identification of a new field which requires a vertical retrace to the top of the display. Detection of such a defined pulse pattern can be used to determine the presence or absence of a valid input signal.

Prior techniques have used discrete components such as non-retriggerable one-shot multivibrators and counters to separate the vertical sync pulses from a television composite sync signal. The sync pulses are then counted to assure that the appropriate number of sequential pulses is present to identify that a valid television signal is present. The identified vertical sync pulse is then used to provide the necessary vertical timing within a television system.

Alternatively complex flip-flop circuitry realized in the form of application specific integrated circuits (ASIC) has been used to perform the same function of pulse width determination based upon counting clock pulses and then counting the number of pulses of the proper width to identify a valid vertical sync pulse which is then used to identify that a valid television signal is present.

Although the prior techniques work adequately, they do not provide flexibility to cope with a noisy input signal, and are somewhat complex. What is desired is a digital timing generator which has high noise immunity, greater flexibility and is relatively simple to implement.

SUMMARY OF THE INVENTION

Accordingly the present invention provides a digital timing generator using a state machine to detect from an input signal a specific pattern of pulses and to determine the presence of a valid input signal based upon the repetition of the pulse pattern at a regular time interval rate. An input stage identifies pulse edge transitions to start pulse duration counting. If the duration exceeds a minimum value and the pulse edge transitions again before the duration exceeds a maximum value, the pulse is accumulated in an event counter. If a predetermined number of pulses of the proper width is counted without overflow, then a valid pulse output is generated. The duration counter may then be used to delay the valid pulse output a desired amount. The valid pulse outputs are accumulated so long as they occur within a specified time interval until a required number of consecutive valid pulse outputs are counted. At that point a valid input signal is indicated. After acquisition if there is a predetermined number of consecutive intervals without a valid pulse output, the loss of the valid input signal is indicated.

The objects, advantages and novel features of the present invention will be apparent from the following detailed description when read in conjunction with the appended claims and attached drawing.

DESCRIPTION OF THE PREFERRED EMBODIMENT

Figure 1:
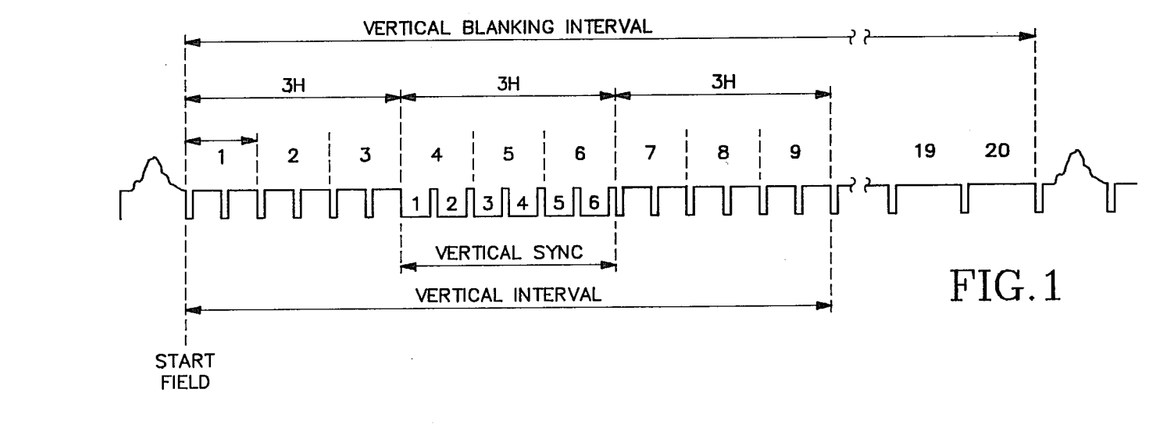
FIG. 1 is a timing diagram of a television composite sync signal for the NTSC television system, including a vertical sync interval, illustrative of an input signal having a specific pulse pattern which repeats at a periodic rate.

Referring now to FIG. 1 a typical input signal having a specific pulse pattern which repeats at a periodic rate is illustrated. This input signal is an NTSC television signal having horizontal sync pulses at a horizontal line rate and a vertical blanking interval at the beginning of each field. Two fields make up a complete picture frame which repeats at a rate, such as thirty Hertz, which eliminates flicker to the observer. The first nine horizontal line intervals of a field make up the vertical interval consisting of three lines of equalizing pulses, which are one-half the width of the horizonal sync pulses occurring at twice the horizontal sync rate, followed by three lines of vertical sync and three more lines of equalizing pulses. As is apparent the differentiation of the vertical sync pulses from the remainder of the television signal is based upon the width and number of consecutive negative pulses which define a specific pulse pattern.

Figure 2:
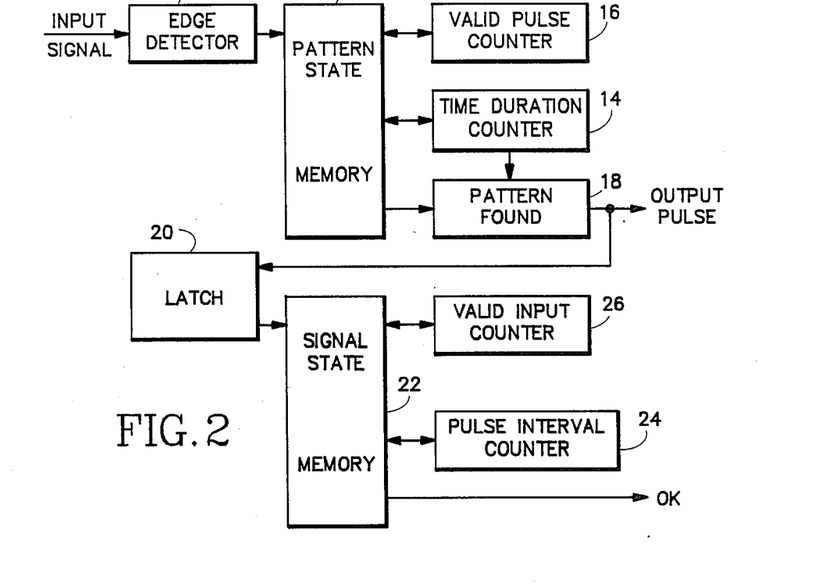
FIG. 2 is a block diagram of a digital timing generator using a state machine according to the present invention.
Figure 3:
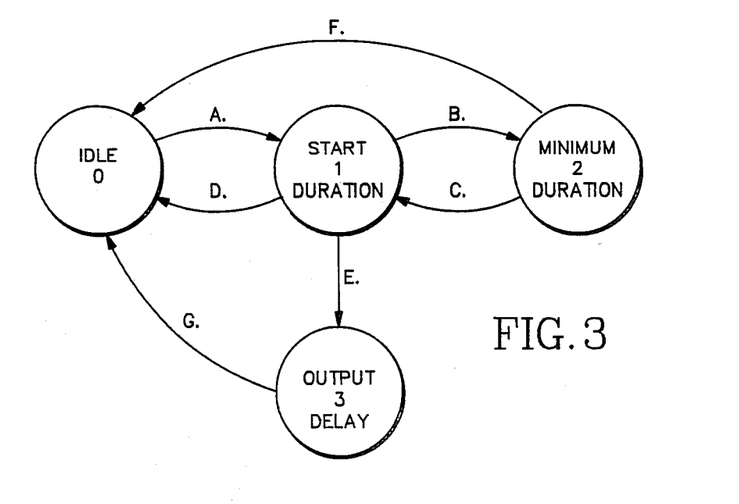
FIG. 3 is a state diagram for a pattern detection state machine according to the present invention.

An input signal having a specific pulse pattern which repeats at a periodic rate, such as the television signal of FIG. 1, is input to an input edge detector 10, as shown in FIG. 2, which outputs a series of pulses corresponding to the leading and trailing edge transitions of the input signal. The output from the input edge detector 10 is input to a pattern state memory 12 which is initially in an idle state as shown in FIG. 3. Upon receipt of an output indicative of a leading pulse edge of the input signal, the pattern state memory 12 starts duration testing by enabling a time duration counter 14. The time duration counter 14 counts clock pulses at a predetermined frequency which is high enough to assure detection of the pulse edges of the shortest anticipated pulse in the input signal. If the pattern state memory 12 receives a trailing pulse edge signal from the input edge detector 10 after a predetermined minimum count is reached by the time duration counter 14, and before a maximum predetermined count is reached, the pattern state memory increments a valid pulse counter 16. If the pattern state memory 12 receives a trailing pulse edge signal from the input edge detector 10 before the predetermined minimum count is reached by the time duration counter 14, the count of the valid pulse counter 16 is checked to determine whether the proper number of consecutive pulses have been counted. If the proper number of pulses have been counted, the pattern state memory 12 may continue the time duration counter 14 to a time a delay interval and a pattern found indication is held in the pattern state memory. After the time out of the delay from the time duration counter 14, the pattern found register 18 is enabled by an output from the time duration counter to generate a valid pulse output at a proper predetermined time with respect to the input signal, i.e., corresponding to a vertical sync time in a television signal to provide proper vertical timing.

The valid pulse output from the pattern found register 18 is input to a latch 20 before being input to a signal state memory 22. The receipt of the valid pulse output by the signal state memory 22 starts a time interval counter 24 and increments a valid input counter 26. If the count of the time interval counter 24 exceeds a maximum value before the next valid pulse output from the pattern found register 18 is received, then both the valid input and time interval counters 26, 24 are reset. Otherwise, for each valid pulse output received the valid input counter 26 is incremented and the time interval counter 24 is reset. When the valid input counter 26 reaches a predetermined count, a signal presence indicator OK is generated. Then the signal state memory 22 uses the valid input counter 26 to count missing valid pulse outputs, i.e., the valid input counter increments for each time that the time interval counter 24 exceeds the maximum value without receiving the valid pulse output from the pattern found register 18. When the valid input counter 26 reaches a second predetermined count indicative of the number of consecutive cycles of the time interval counter 24 without receiving the valid pulse output from the pattern found register 18, then the signal state memory 22 generates a signal absence indicator /OK.

For the detection of the vertical sync from a PAL television signal the present invention will be described in more detail with respect to FIGS. 4A-4C and 6. A PAL vertical sync has a pattern of five wide negative pulses in sequence as opposed to six wide negative pulses for NTSC. The input signal CSIN is the television composite sync signal. D-type flip-flops 30, 32 make up the input edge deetector 10. The flip-flops 30, 32 are connected in series with CSIN input at the D input of the first flip-flop and the Q output of the first flip-flop connected to the D input of the second flip-flop. The negative, or leading, edge of pulses in CSIN is detected by combining the respective Q/ and Q outputs. Due to the time delay of the flip-flops when the state at the input of the first flip-flop 30 changes, the next clock pulse of CLK1 transfers the existing inputs to the output so that the Q output of the second flip-flop 32 is still high when the Q/ output of the first flip-flop goes high. The period of CLK1 is less than the pulse width of the shortest pulse of CSIN to assure that all pulse edges are detected.

The pattern state memory 12 (FIG. 4A) has two J-K flip-flops 38, 40 to provide the necessary four state outputs. The respective J-K inputs are connected to respective logic circuits 42, 50 consisting of AND gates 43-47, OR gate 48 and AND gates 51-56, OR gate 57 respectively. The logic circuits 42, 50 provide the combinational logic for switching states of the pattern state memory 12. The pattern state memory flip-flops 38, 40 are clocked by CLK1 to change state whenever a logical "1" is present at the J-K inputs. The pattern state memory flip-flops 38, 40 are reset by VBP when a valid pattern is found. AND gate 43 provides an input to flip-flop 38 via OR gate 48 when the state of the pattern state memory 12 is even and a leading negative edge is detected to switch the state to the next higher odd state. AND gate 44 provides an input to flip-flop 38 via OR gate 48 when CSIN is high, the state is "1", and the number of pulses in the pattern is less than 4 to switch the state to "0". AND gate 45 provides an input to flip-flop 38 via OR gate 48 when CSIN is high, the state is "1" and the number of pulses counted in the pattern is even to switch the state to "0". AND gates 46, 47 provide an input to flip-flop 38 via OR gate 48 and AND gates 55, 56 provide an input to flip-flop 40 via OR gate 57 when CSIN is low, i.e., in the middle of a pulse, the state is "1", and the minimum duration value from the time duration counter 14 is achieved to switch the state to "2".

Figure 4A:
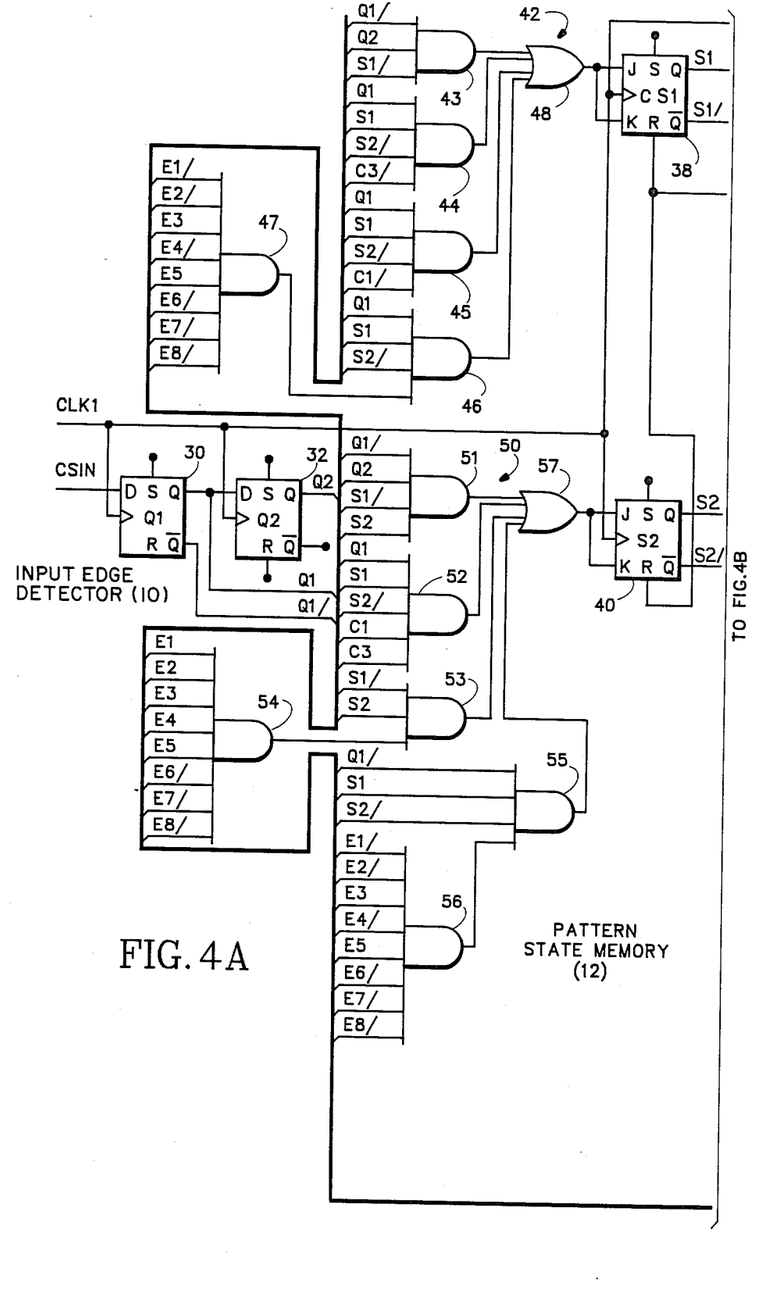
FIGS. 4A–C are a schematic diagram for the pattern detection state machine of FIG. 3.
Figure 4B:
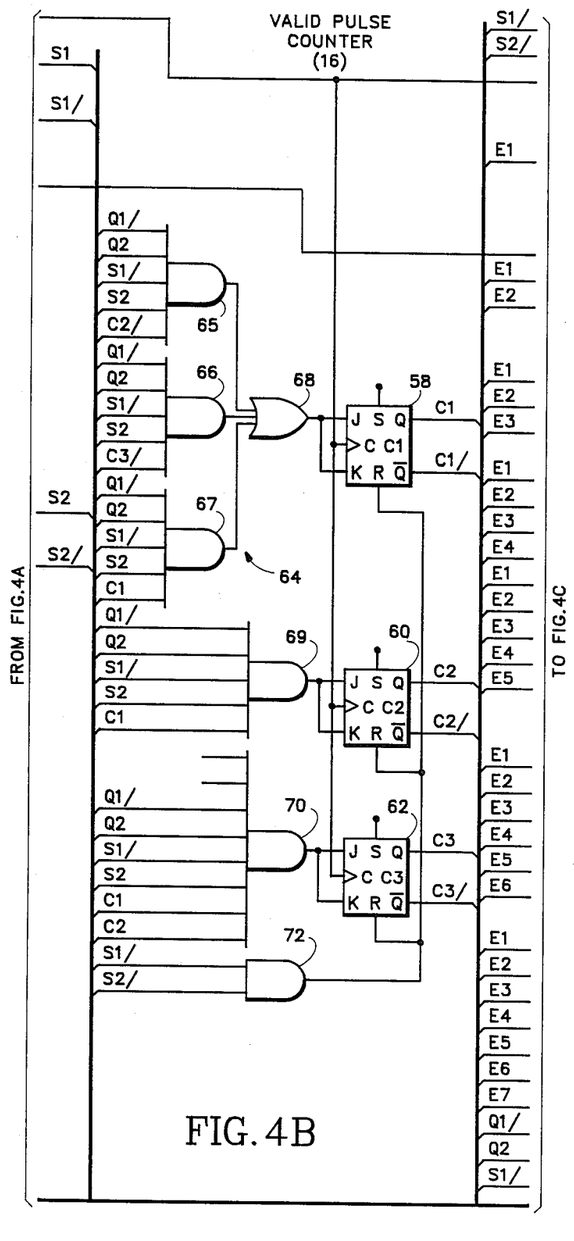
Figure 4C:
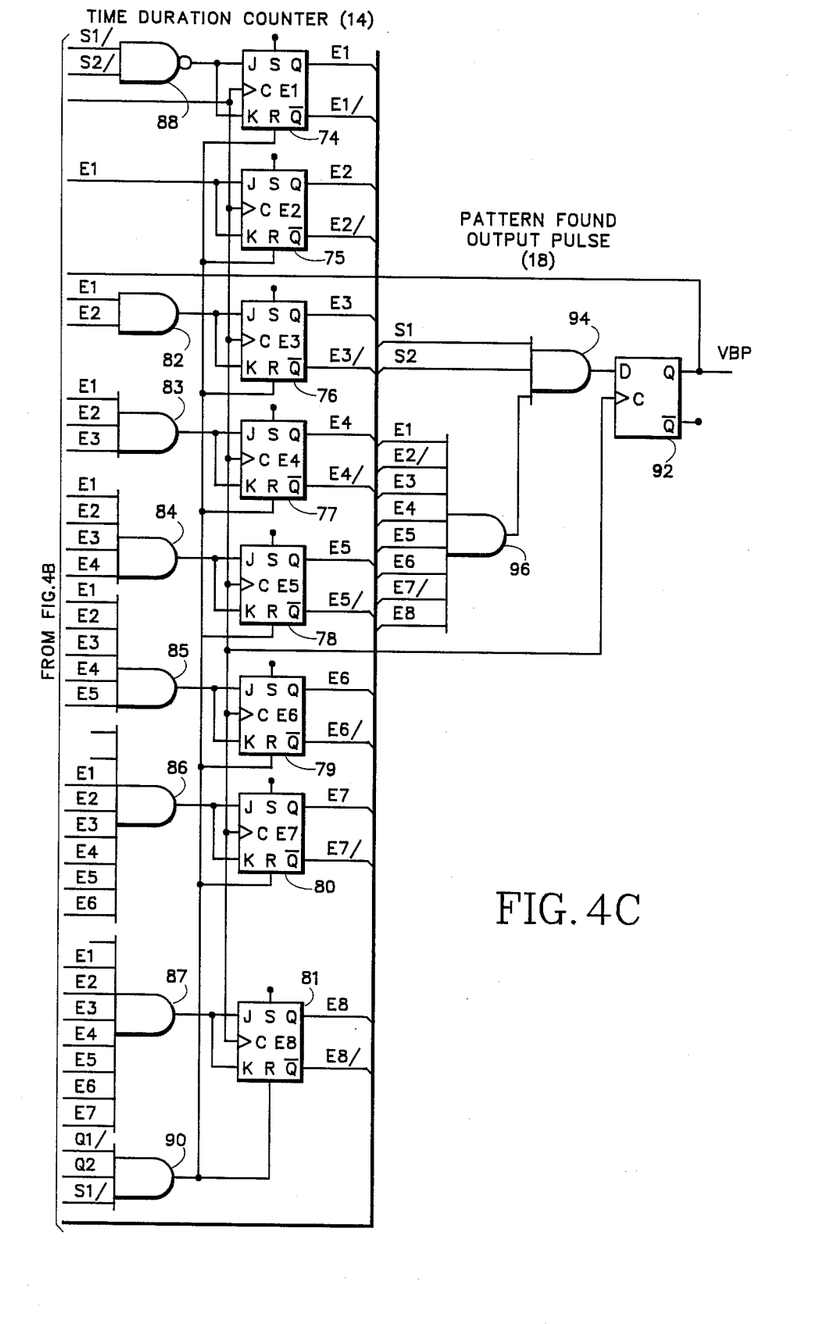

AND gate 51 provides an input to flip-flop 40 via OR gate 57 when there is a leading pulse edge of CSIN detected and the state is "2" to switch the state to "0". AND gate 51 provides an input to flip-flop 40 via OR gate 57 when CSIN is high, the state is "1" and the number of consecutive pulses counted is equal to five to switch the state to "3". Finally AND gates 53, 54 provide an input to flip-flop 40 via OR gate 57 when the state is "2" and the maximum pulse width duration is exceeded to switch the state to "0".

The valid pulse counter 16 (FIG. 4B) has three J-K flip-flops 58, 60, 62 which act as a ripple counter which is incremented when the negative pulse edge of CSIN is detected commencing with the first negative transition after the initial valid pulse width is detected. Logic circuit 64, consisting of AND gates 65-67, OR gate 68 connected to the inputs of the first flip-flop 58, causes the counter 16 to increment when the count value is odd or when a total count of six has not been achieved while the state is "2". AND gates 69, 70 are connected to respective inputs of the subsequent flip-flops 60, 62 so that the pulse counter 16 increments up to six for each detected leading edge of CSIN while in state "2". The valid pulse counter 16 is reset via AND gate 72 whenever the state is "0".

The time duration counter 14 (FIG. 4C), consisting of flip-flops 74-81 and AND gates 82-87, counts the pulses of CLK1 so long as the state is not "0" as provided by NAND gate 88 to the input of the first flip-flop. The time duration counter 14 is reset via AND gate 90 on the leading edge of a pulse of CSIN when the state is even.

Finally the pattern found output pulse register 18 (FIG. 4C) consists of a D-type flip-flop 92 clocked by CLK1 according to the input from AND gates 94, 96. These AND gates 94, 96 provide a logical "1" to the D input of the flip-flop 92 when the state is "3" and the duration from the duration counter 14 is equal to the desired time delay. The output from the pattern found register 18 is a valid pulse output VBP which indicates that the predetermined vertical sync pulse pattern has been identified.

Figure 6:
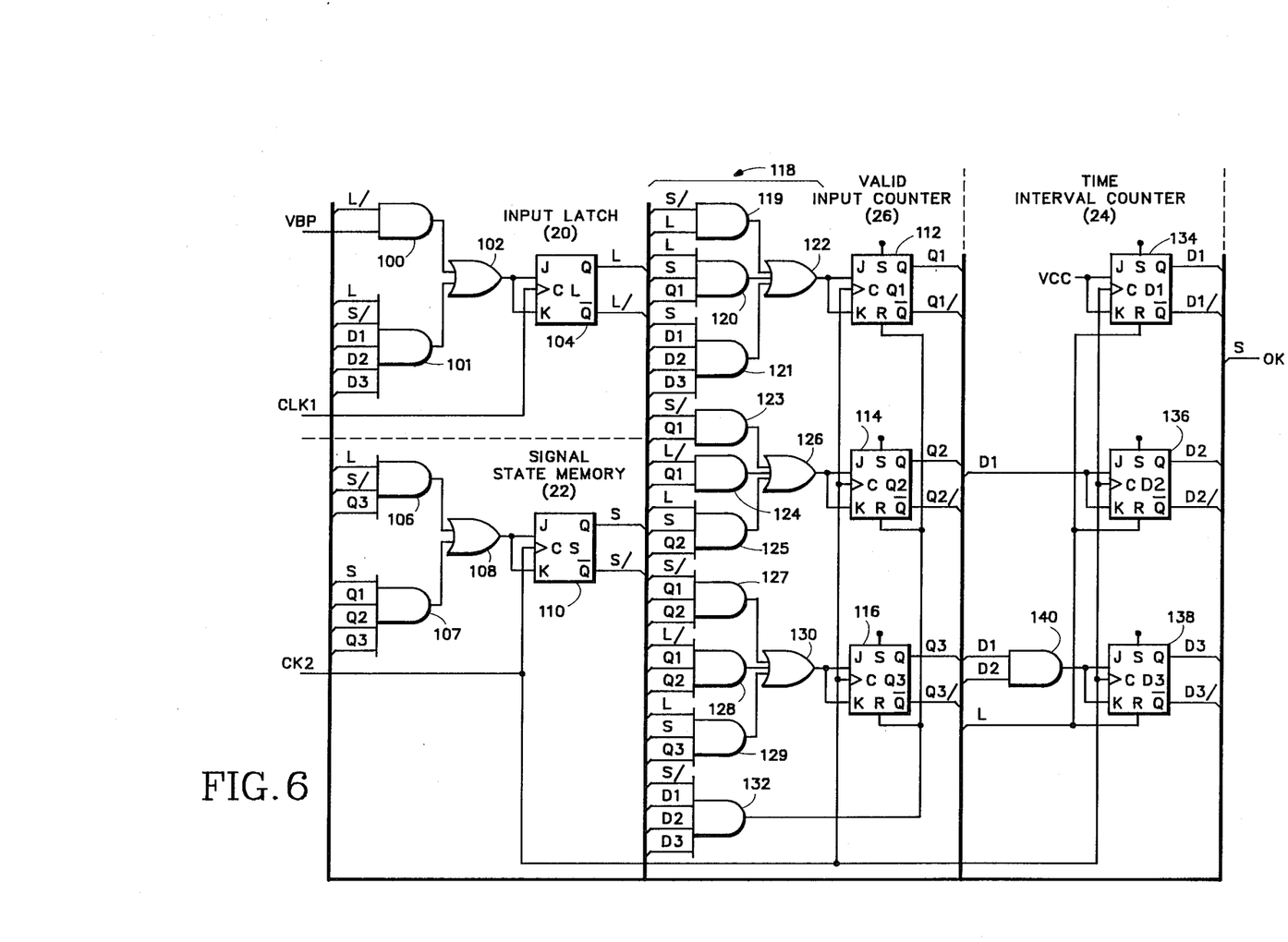
FIG. 6 is a schematic diagram for the valid signal state machine of FIG. 5.

The VBP pulse is input via AND gate 100 and OR gate 102 to the inputs of a J-K flip-flop 104, which is the input latch 20, when the Q output of the flip-flop is low to switch the Q output high upon receipt of the next CLK1 pulse. The latch flip-flop 104 is "reset" when the time duration counter 24 reaches its maximum count while still in state "0". The signal state memory 22 has a single J-K flip-flop 110 for the necessary two states with inputs via AND gates 106, 107 and OR gate 108. When the state is "0", the output of the latch flip-flop 104 indicates a received VBP pulse and the count of the valid input counter 26 is four, the state flip-flop 110 is switched from state "0" to state "1" upon being clocked by a low speed clock CLK2. While in state "1" the state flip-flop 110 is switched to state "0" when the valid input counter 26 reaches its maximum count.

J-K flip-flops 112-116 with associated input logic circuit 118 make up the valid input counter 26. AND gates 119, 123, 127 via respective OR gates 122, 126, 130 provide the inputs to the respective flip-flops 112-116 to count the number of consecutive VBP pulses received by the input latch 20 when the state is "0". When the state is "1", indicating that a valid signal has been acquired, AND gates 120, 125, 129 via the respective OR gates 122, 126, 130 "reset" the respective flip-flops 112-116 to maintain the count at zero as long as the input signal is present as indicated by the state "1" condition. AND gates 121, 124, 128 via the OR gates 122, 126, 130 cause the respective flip-flops 112-116 to increment for each missing VBP pulse, i.e., a VBP pulse is not received before the duration counter 24 reaches its maximum count. The flip-flops 112-116 are also reset via AND gate 132 when the state is "0" and the time interval counter 24 reaches its maximum count.

The time interval counter 24 is made up of J-K flip-flops 134-138 and AND gate 140 to count consecutive pulses of the low speed clock CLK2. The maximum count of the time interval counter 24 represents a maximum time interval greater than the repetition period of the vertical sync pattern. The flip-flops 134-138 are reset each time a valid pulse output VBP is received, i.e., nominally when a valid input signal is present before the time interval counter 24 reaches its maximum count. The output of the signal state memory flip-flop 110 is the signal presence indicator OK.

Figure 5:
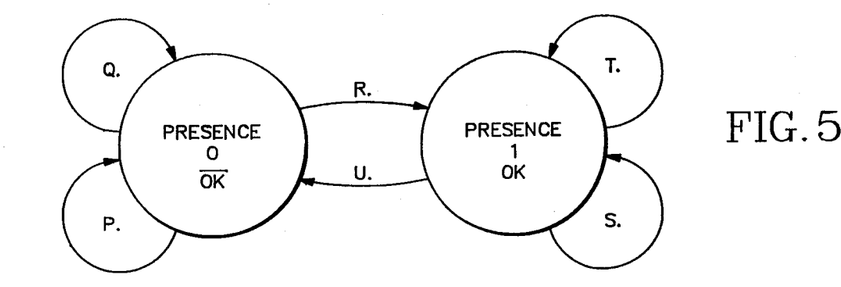
FIG. 5 is a state diagram for a valid signal state machine according to the present invention.

The state diagrams of FIGS. 3 and 5 further illustrate the operation of the digital timing generator. The pattern state memory 12 is initially in an idle state "0". The transition from state "0" to state "1" along path A occurs when the leading edge of a pulse is detected by the input edge detector 10. Simultaneously the time duration counter 14 is reset, the valid pulse counter 16 already having been reset by the transition into state "0". In state "1" the time duration counter 14 starts to count clock pulses. If the input signal transitions before a minimum count is achieved and the valid pulse count is not the desired value, state "1" transitions along path D to state "0" which resets the valid pulse counter 16. However if the minimum count is achieved before the input signal transitions, state "1" transitions along path B to state "2", i.e., the pulse width of the input signal pulse has exceeded a minimum width. The time duration counter 14 continues to count until either another leading edge signal occurs or a maximum count is achieved. If a leading edge signal is first detected and the valid pulse counter 16 has not exceeded the desired value, then the valid pulse counter is incremented, the time duration counter 14 is reset and state "2" transitions along path C to state "1". If the maximum count is achieved first, indicating that the pulse width is too long, state "2" transitions along path F to state "0", esetting the valid pulse counter 16.

When in state "1" if the input pulse transitions before the minimum count is achieved and the valid pulse count is at the desired value, then state "1" transitions along path E to state "3", indicating that a valid input pulse pattern has been detected. The time duration counter 14 continues to count up to the desired delay value, at which point a valid pulse output VBP is generated from the pattern found register 18 and state "3" transitions along path G to state "0".

Referring to the state diagram of FIG. 5 for the signal state memory 22, the output pulse VBP from the pattern found register 18 is input to the latch 20 to synchronize the pulse with the low rate input clock used for the valid signal identification. Initially the signal state memory 22 is in state "0" indicating no signal present. The VBP pulse is received from the latch 20 and increments the valid input counter 26 if the count is less than a predetermined minimum value, indicated by path P. If the time interval counter 24 is over the maximum time befoe the VBP pulse is received, then the time interval valid input counters 24, 26 are reset following path Q, indicating no valid signal present. If the valid input counter 26 is equal to the minimum value when the VBP pulse is received, then state "0" transitions along path R to state "1" to indicate a valid signal present and both counters are reset.

While in state "1" for each subsequent input pulse VBP received the counters 24, 26 are reset, indicated by path S. If no input pulse is received within the period of the time interval counter 24 and the value in the valid input counter 26 is less than a predetermined maximum value, then the time duration counter is reset and the valid input counter is incremented, indicated by path T. If the value in the valid input counter 26 is at the maximum value when the time duration counter 24 times out without the receipt of an input pulse, then state "1" transitions along path U to state "0" indicating the loss of the valid input signal, and the counters 24, 26 are reset.

Thus the present invention provides a digital timing generator using a state machine for determining the presence of a predetermined pulse pattern, and for indicating that a valid input signal is present based upon the repetition of the predetermined pulse pattern.

What is claimed is:

1. A digital timing generator for detecting an input signal having a predetermined pulse pattern recurring at a periodic rate comprising:
   means for detecting pulse edges of pulses in the input signal;
   means for determining from the pulse edges the pulse widths for each pulse;
   means for counting the consecutive pulses having pulse widths which satisfy the predetermined pulse pattern; and
   means for generating a valid pulse output when the output of the counting means reaches a predetermined valve indicating the presence of the predetermined pulse pattern.

2. A digital timing generator as recited in claim 1 further comprising means for delaying the valid pulse output for a predetermined time interval.

3. A digital timing generator as recited in claim 1 further comprising means for automatically detecting from the valid pulse output the presence of the input signal by integrating over a predetermined time period based upon the periodic rate.

4. A digital timing generator as recited in claim 3 wherein the automatically detecting means comprises:
   means for timing a maximum time interval from the receipt of the valid pulse output, the maximum time interval being greater then the interval of the periodic rate;
   means for counting the number of consecutive valid pulse outputs received without the timing means reaching the maximum time interval, each valid pulse output resetting the timing means;

means for counting the number of consecutive maximum time intervals without the receipt of the valid pulse output; and means for indicating the presence of the input signal when the valid pulse output counting means reaches a predetermined minimum value and the absence of the input signal when the maximum time interval counting means reaches a predetermined maximum value.

5. A digital timing generator for determining the presence of an input pattern having an identifying pulse which repeats at a periodic rate comprising:

means for timing a maximum time interval starting with the receipt of the identifying pulse which is larger than the interval corresponding to the periodic rate;

means for counting the number of consecutive identifying pulses received without the timing means reaching the maximum time interval, each identifying pulse resetting the timing means;

means for counting the number of consecutive maximum time intervals without the receipt of the identifying pulse; and means for indicating the presence of the input signal when the identifying pulse counting means reaches a predetermined minimum value and the absence of the input signal when the maximum time interval counting means reaches a predetermined maximum value.

6. A method for determining the presence of a predetermined pulse pattern in an input signal, the predetermined pulse pattern repeating at a periodic rate, comprising the steps of:

detecting the pulse edges of pulses in the input signal;

determining the pulse width of the pulses from the pulse edges;

counting the number of pulses having pulse widths corresponding to the pulses of the predetermined pulse pattern;

generating a valid pulse output when the count of the counting means reaches a predetermined value indicative of the presence of the predetermined pulse pattern.

7. A method as recited in claim 6 further comprising the step of delaying the valid pulse output for a predetermined time interval.

8. A method as recited in claim 6 further comprising the step of automatically detecting from the valid pulse output the presence of the input signal by integrating over a predetermined time period based upon the periodic rate.

9. A method as recited in claim 8 wherein the automatic detecting step comprises the steps of:

timing a maximum time interval from the receipt of the valid pulse output;

counting the number of consecutive valid pulse outputs received without the maximum time interval being reached, each receipt of the valid pulse output restarting the timing of the maximum time interval;

counting the number of consecutive maximum time intervals cycled through without the receipt of the valid pulse output; and indicating the presence of the input signal when the number of consecutive valid pulse outputs counted reaches a predetermined minimum value and the absence of the input signal when the number of consecutive maximum time intervals counted reaches a predetermined maximum value.

10. A method for determining the presence of an input signal having an identifying pulse that recurs at a periodic rate comprising the steps of:

timing a maximum time interval from the receipt of the identifying pulse;

counting the number of consecutive identifying pulses received without the maximum time interval being reached, each identifying pulse restarting the timing of the maximum time interval;

counting the number of consecutive maximum time intervals cycled through without the receipt of the identifying pulse; and indicating the presence of the input signal when the number of consecutive identifying pulses counted reaches a predetermined minimum value and the absence of the input signal when the number of consecutive maximum time intervals counted reaches a predetermined maximum value, the counting of the identifying pulses occurring prior to the indication of the presence of the input signal and the counting of the maximum time intervals occurring after the indication of the presence of the input signal.

* * * * *